US006609589B2

(12) United States Patent
Combest

(10) Patent No.: US 6,609,589 B2
(45) Date of Patent: Aug. 26, 2003

(54) SPEAKER ENCLOSURE AND MOUNTING METHOD FOR ISOLATING AND INSULATING FACEPLATE AND HEAVY SPEAKERS FROM SURROUNDING MOUNTING SURFACE

(75) Inventor: Christopher E. Combest, Leawood, KS (US)

(73) Assignee: Multi Service Corporation, Overland Park, KS (US)

( * ) Notice: Subject to any disclaimer, the term of this patent is extended or adjusted under 35 U.S.C. 154(b) by 17 days.

(21) Appl. No.: 10/058,598

(22) Filed: Jan. 28, 2002

(65) Prior Publication Data

US 2003/0141141 A1 Jul. 31, 2003

(51) Int. Cl.[7] .................................................. H05K 5/00
(52) U.S. Cl. ........................ 181/150; 181/199; 381/345; 381/152
(58) Field of Search ................................. 181/150, 141, 181/199, 156, 207, 148; 381/386, 395, 396, 345, 188, 152, 205, 353, 354

(56) References Cited

U.S. PATENT DOCUMENTS 4,251,045 A * 2/1981 Meyerle ..................... 181/148
4,296,280 A * 10/1981 Richie ........................ 181/150
4,924,963 A * 5/1990 Polk ........................... 181/150
5,082,083 A * 1/1992 Draffen ...................... 181/150
5,113,968 A * 5/1992 Lemmon .................... 181/150
5,261,721 A * 11/1993 Conger et al. ......... 296/146.15
5,400,412 A * 3/1995 King et al. ................. 181/150
5,739,481 A * 4/1998 Baumhauer et al.
6,070,694 A * 6/2000 Burdett et al. .............. 181/150
6,415,886 B1 * 7/2002 Combest ..................... 181/150

FOREIGN PATENT DOCUMENTS

JP 05344575 A * 12/1993 ............ H04R/1/02

* cited by examiner

*Primary Examiner*—Bentsu Ro
*Assistant Examiner*—Eduardo Colon-Santana
(74) *Attorney, Agent, or Firm*—Hovey Williams LLP

(57) ABSTRACT

A speaker enclosure (10) comprising a speaker box (12) having an opening (27) and adapted for mounting within a wall (20) upon a wall stud (22); a compressible gasket (14) affixed about the box opening (27); a faceplate (16); and a plurality of independently adjustable coupling mechanisms (18) for coupling the faceplate (16) with the box (12). The protruding, uncompressed gasket (14) is compressed by the faceplate (16) and the coupling mechanisms (18), which may be independently adjusted to provide an optimum and substantially uniform degree of separation between faceplate (16) and wall (20), thereby reducing distortion, vibration, and damage due to undesirable contact therebetween. A spring (160) is provided to prevent over-compression of the gasket (14) due to heavy or low frequency speakers, thereby facilitating maintaining the uniform degree of separation; and a spacer (162) is provided to maintain the spring (160) in its operating position.

8 Claims, 3 Drawing Sheets

SPEAKER ENCLOSURE AND MOUNTING METHOD FOR ISOLATING AND INSULATING FACEPLATE AND HEAVY SPEAKERS FROM SURROUNDING MOUNTING SURFACE

BACKGROUND OF THE INVENTION

1. Field of the Invention

The present invention relates to speaker enclosures or cabinets recessedly mounted beneath a surface or within a structure. More particularly, the invention relates to a speaker enclosure adapted for in-wall mounting and having a suspending or isolating and insulating gasket, a spring, and a spacer providing an optimum or desirable degree of uniform separation between the enclosure faceplate and the wall in which the enclosure is mounted so as to prevent sound distortion and wall damage due to improper installation or vibrations.

2. Description of the Prior Art

Those with skill in the art of home theater systems and speaker enclosures or cabinets will appreciate that a number of strategically placed speakers are often desirable in order to produce the best sound. This is true, for example, in home theater systems employing left and right main, left and right surround, center, and sub-woofer speaker groupings, with each such grouping typically comprising a variety of individual specialized speakers, such as high-range "tweeters", mid-rangers, and low-range "woofers". Often, it is desirable that at least some of the speakers be placed upon shelves or otherwise raised so as to minimize sound absorption and interference, tripping hazards, and aesthetic disappear associated with floor-placed speakers. As will also be appreciated, speaker sound quality is directly related to the weight of the speaker magnet, thus many audiophiles insist on increasingly heavier speakers.

A well-known solution to strategic and aesthetic speaker placement is wall- or ceiling-mounting by cutting holes in drywall, wallboard, or other building material to receive and hold each individual speaker. Unfortunately, the speakers are typically mounted upon or in contact with the drywall, resulting in drywall cracks or other failure due to vibrations transmitted by the operational speakers. Furthermore, direct speaker-to-drywall contact can result in absorption, interference, or other undesirable sound distortion.

Another solution is to place the speakers within an enclosure and mount the enclosure to the wall or ceiling. Such enclosures are typically designed to enhance speaker performance by minimizing unwanted vibrations and optimizing air flow to the speakers. Unfortunately, an enclosure and its speakers, weighing a combined thirty or more pounds, can cause the mounting surface to bow or fail, again resulting in drywall cracks or failure and possibly allowing the enclosure to fall. This is of particular concern where relatively thin drywall or other building materials have been used to save costs. Furthermore, adjacent wall and ceiling structures can cause undesirable sound distortion or vibrations and are subject to damage when transmitted speaker-generated vibrations reach certain magnitudes or frequencies. Such vibration can also lead to a loosening and separation of the enclosure mount from the mounting surface.

Some of the above-described problems can be solved by mounting speaker enclosures within walls or ceilings rather than to their surfaces. That is, rear and side portions of an enclosure are recessed within the wall, and preferably coupled with one or more wall studs, so that only a flush-mounted faceplate protrudes and is seen, with the speakers being mounted to an interior surface of the faceplate. Unfortunately, though the enclosure may be mounted to wall studs, contact between the faceplate and drywall can still cause bowing, cracking or failure thereof, particularly where the faceplate is overtightened thereupon during installation. Furthermore, even though the faceplate does not depend directly from the drywall, speaker vibrations can still be transmitted from the enclosure via the mounting studs to the drywall, which, again, may cause cracking, sound distortion, or other undesirable effects.

Additionally, even where a compressible material, such as, for example, a tubular gasket, is used to insulate or isolate the faceplate from the drywall, a heavy or low frequency speaker, such as a bass woofer or sub-woofer, can cause some or all portions of the the compressible material to over-compress or to compress unevenly. Typically, due to the substantial weight or low frequency of such speakers, a bottom portion of the compressible material compresses to a far greater degree than a top portion thereof, thereby undesirably causing the faceplate to appear unevenly mounted upon the drywall, and potentially causing the faceplate to continually or intermittently physically contact the drywall at or near the over-compressed bottom portion of the compressible material, resulting in the aforementioned damage and acoustic problems.

Due to the above-identified and other problems in the art, a need exists for an improved speaker enclosure and mounting method.

SUMMARY OF THE INVENTION

The speaker enclosure of the present invention overcomes the above-identified and other problems in the art to provide a simple and inexpensive enclosure and mounting method for suspending or isolating and insulating the faceplate and speakers from the mounting wall, thereby reducing distortion, vibration, and damage due to undesirable contact and transmission of speaker vibrations. Specifically, the present invention comprises a speaker enclosure adapted for in-wall mounting and having a heavy duty compressible rubber gasket, preferably including a collapsible tubular air chamber or pocket, interposed between faceplate and speaker box to prevent overtightening of the faceplate to the drywall and thereby provide an optimum or desirable degree of contact separation and sound insulation.

The preferred enclosure comprises a speaker box presenting an access opening and adapted for mounting upon one or more wall studs and dimensioned so as to fit between exterior and interior wall surfaces; an isolating and insulating gasket affixed about a perimeter of the box opening; a faceplate to which the speakers are mounted; and a plurality of independently adjustable threaded coupling mechanisms for coupling the faceplate with the box. The speaker box is mounted so that the uncompressed gasket protrudes beyond the drywall surface, and provides, when compressed, an optimum or desired degree of uniform separation between faceplate and drywall. The insulating gasket is further able to absorb speaker-generated vibrations that might otherwise be transmitted via the wall studs to cause sound distortion or damage the drywall.

Recognizing that heavier or low frequency speakers, such as bass woofers or subwoofers, can cause over-compression or uneven compression of the gasket, an equally preferred alternative embodiment of the enclosure adds a spring and a spacer ring to some or all of the coupling mechanisms to resist undesirable over-compression of the gasket, particularly a lower portion thereof, thereby facilitating maintaining the optimum or desired degree of uniform separation between the faceplate and the drywall.

These and other important aspects of the present invention are more fully described in the section entitled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
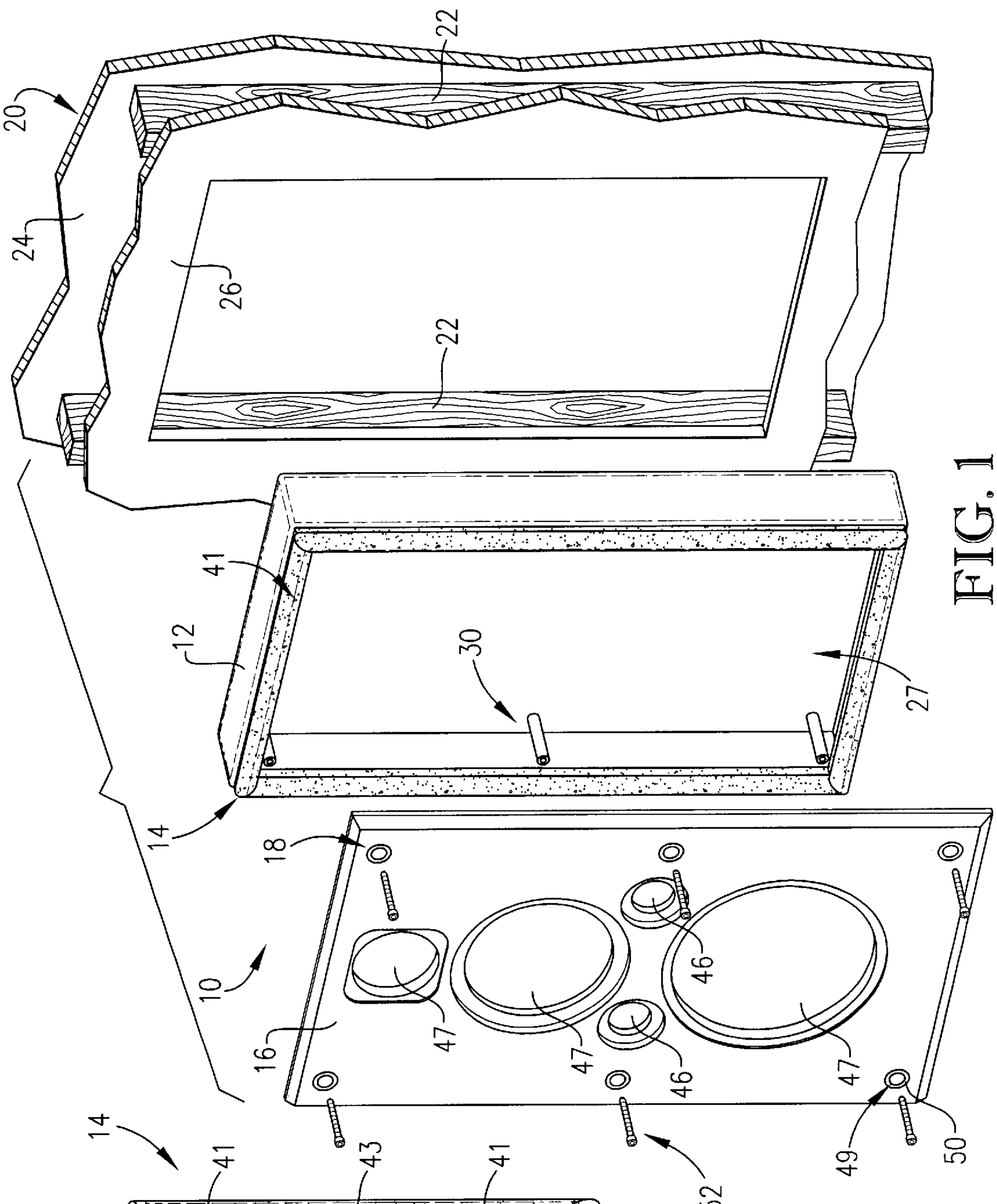
FIG. 1 is exploded isometric view of a preferred embodiment of the speaker enclosure of the present invention.

Referring to FIG. 1, a speaker enclosure 10 is shown constructed in accordance with a preferred embodiment of the present invention, and broadly comprising a speaker box 12; a gasket 14; a faceplate 16; and a plurality of independently adjustable coupling mechanisms 18. As described in more detail below, the speaker enclosure 10 is operable to securely mount one or more speakers (not shown) within a wall 20, achieve an optimum degree of separation between the faceplate 16 of the enclosure 10 and a drywall surface 26 of the mounting wall 20, and to insulate from transmitted speaker vibrations one or more wall studs 22 from which the enclosure 10 depends. Although illustrated as being mounted within a wall, the speaker box portion 12 of the enclosure 10 may be mounted beneath any suitable surface or within any suitable structure, including ceilings or floors.

The speaker box 12 protectively houses the speakers within the wall 20 and provides a mounting surface and mechanism for coupling the enclosure 10 with one or more wall studs 22. The speaker box 12 is preferably constructed of metal, having a top, bottom, sides, back, and a speaker opening 27, and is dimensioned so as to enclose a desired number and size of speakers while fitting between adjacent wall studs 22 and between wall sheathing 24 and interior drywall surfaces 26. The speaker box 12 may be mounted to the wall studs 22 in any conventional manner; however, a preferred manner of mounting is described in detail in pending application titled "In-Wall Speaker Mounting Apparatus", Ser. No. 09/515,810, filed Feb. 29, 2000, hereby incorporated by reference as though set forth in the present application.

Figure 2:
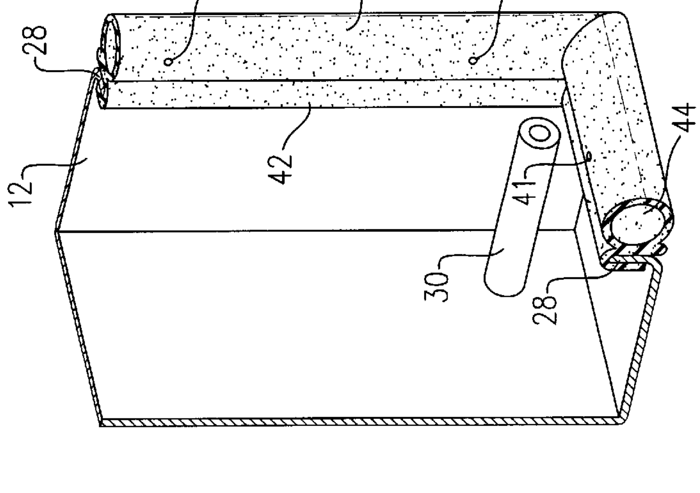
FIG. 2 is a fragmentary sectional view of a portion of the preferred speaker enclosure shown in FIG. 1.

As is best illustrated in FIG. 2, the speaker box 12 presents a circumferential lip 28 extending about the speaker opening 27. The speaker box 12 further includes a plurality of substantially hollow mounting pylons 30 having female receiving threads and secured to and projecting from the back portion of the box 12. These pylons 30 form a part of the coupling mechanisms 18, which are described in more detail below.

Figure 4:
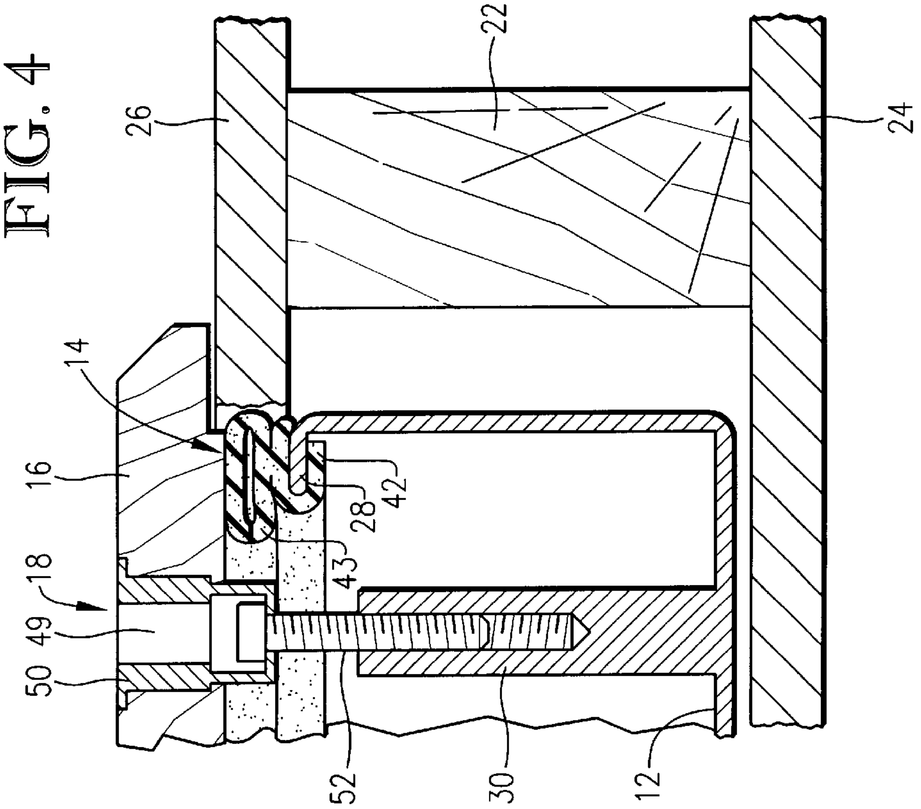
FIG. 4 is a fragmentary sectional view of the preferred speaker enclosure of FIG. 1 wherein the faceplate is in a final mounting position with the isolating and insulating gasket compressed to provide the optimum degree of separation between the faceplate and a mounting surface.
Figure 3:
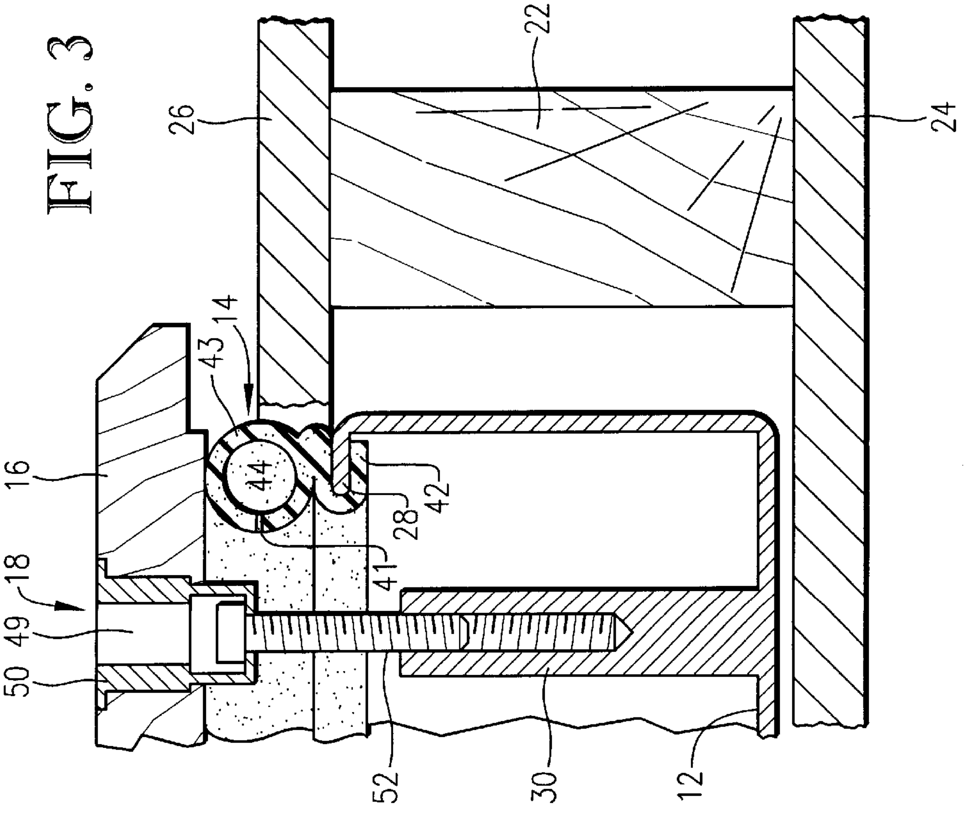
FIG. 3 is a fragmentary sectional view of the preferred speaker enclosure of FIG. 1 wherein the faceplate is in an initial mounting position with the isolating and insulating gasket uncompressed.

Referring also to FIGS. 3 and 4, the gasket 14 operates to suspend or isolate the faceplate 16 from the drywall 26 by ensuring optimum separation therebetween, and to insulate the studs 22 from transmitted speaker vibrations. The gasket 14 is preferably heavy duty, being made of rubber or similar material, and preferably includes a tubular portion 43, having an outside diameter of approximately one-half inch, defining continuous and a collapsible air pocket 44 for maintaining isolative and insulative qualities even while under compression. The pocket 44 is collapsible due to a plurality of spaced apart air holes 41 for allowing air to escape the pocket 44 as the gasket 14 is compressed and to reenter the pocket 44 as compression is relieved. The gasket 14 also presents a channel 42 for receiving and clamping or crimping upon the box lip 28. Alternatively or additionally, adhesives may be used as needed or desired to permanently or removably secure the gasket 14 to the lip 28.

An exemplary gasket is used in many automobiles to seal doors or hatches. This type of gasket is suitable because of its heavy duty, wear-resistant nature and its relatively large size. A larger-sized gasket, particularly a larger tubular portion 43, allows for both attachment to the recessed speaker box 12 and sufficient protrusion (approximately one-quarter inch) beyond the drywall surface 26 (assume standard half-inch drywall thickness) to compress under pressure of the installed faceplate 16 while leaving an optimum degree of isolating separation between drywall 26 and faceplate 16.

The faceplate 16, once installed over the speaker opening 27 of the box 12, completes the enclosure 10. The faceplate 16 is preferably made of an aesthetically pleasing material, such as wood, and is provided with air ports 46 and speaker holes 47 through which individual speakers (not shown), including tweeters, mid-rangers, and woofers, can be mounted. The number and size of these ports and holes 46,47 is design dependent. The faceplate 16 is also provided with a plurality of holes 49 for accommodating the coupling mechanisms 18, the exact number of which depends upon the size of the faceplate 16, as described below.

The coupling mechanisms 18 secure the faceplate 16 to the box 12. Each coupling mechanism 18 is independently adjustable, comprising a sleeve 50; a bolt 52; and on of the mounting pylons 30 mentioned above. The sleeve 50 fits into the hole 49 in the faceplate 16 and slidably receives the bolt 52, thereby aesthetically minimizing the bolt's appearance and eliminating unsightly protrusion of the bolthead above the faceplate surface. The bolt 52 is conventional and threadably received within the mounting pylon 30. It is contemplated that in some embodiments a travel limiting stop may be provided to prevent overtightening the faceplate 16 to the box 12.

Because the coupling mechanisms 18 are independently adjustable and arranged about the perimeter of the faceplate 16, a substantially uniform degree of separation may be obtained, regardless of faceplate 16 or wall 22 irregularities, or non-flush or otherwise improper speaker box mounting. Therefore, the exact number, spacing, and location of the coupling mechanisms 18 depends upon the size and shape of the faceplate 16 as there should be a sufficient number to be spaced at reasonable distances about the perimeter of the faceplate 16 to account for warpage or other distortion or irregularity. In the illustrated embodiment, for example, there are shown six independently adjustable coupling mechanisms 18, with one at each corner and one midway along each long side, the result being that all coupling mechanisms 18 are spaced equidistant apart, approximately eleven inches, from one another along the faceplate perimeter. In general, optimum spacing will depend upon the nature of the material, size and shape of the faceplate, and the particular application.

Referring primarily to FIGS. 3 and 4, in operation, a hole is cut or otherwise provided in the drywall 26 so as to receive the speaker box 12 and allow the box 12 to be mounted to one or more wall studs 22. The speaker box 12 is mounted substantially flush with the inner surface of the drywall 26. The gasket 14 will already have been coupled with the box 12; the box lip 28 being received within the gasket channel 42. The gasket 14, not being compressed, will protrude outward from the wall 20 approximately one-quarter inch.

The faceplate 16 is then fitted over the box opening 27, such that the male bolts 52 align with the female pylons 30. The bolts 52 are tightened and adjusted independently so as to bring the faceplate 16 into contact with the gasket 14, compressing the gasket 14 and collapsing the air pocket 44 until a substantially uniform degree of separation between faceplate 16 and wallboard 26 is achieved, with the optimum degree of separation being preferably 1/32 inch, or between 1/64 inch and 3/64 inch.

Figure 5:
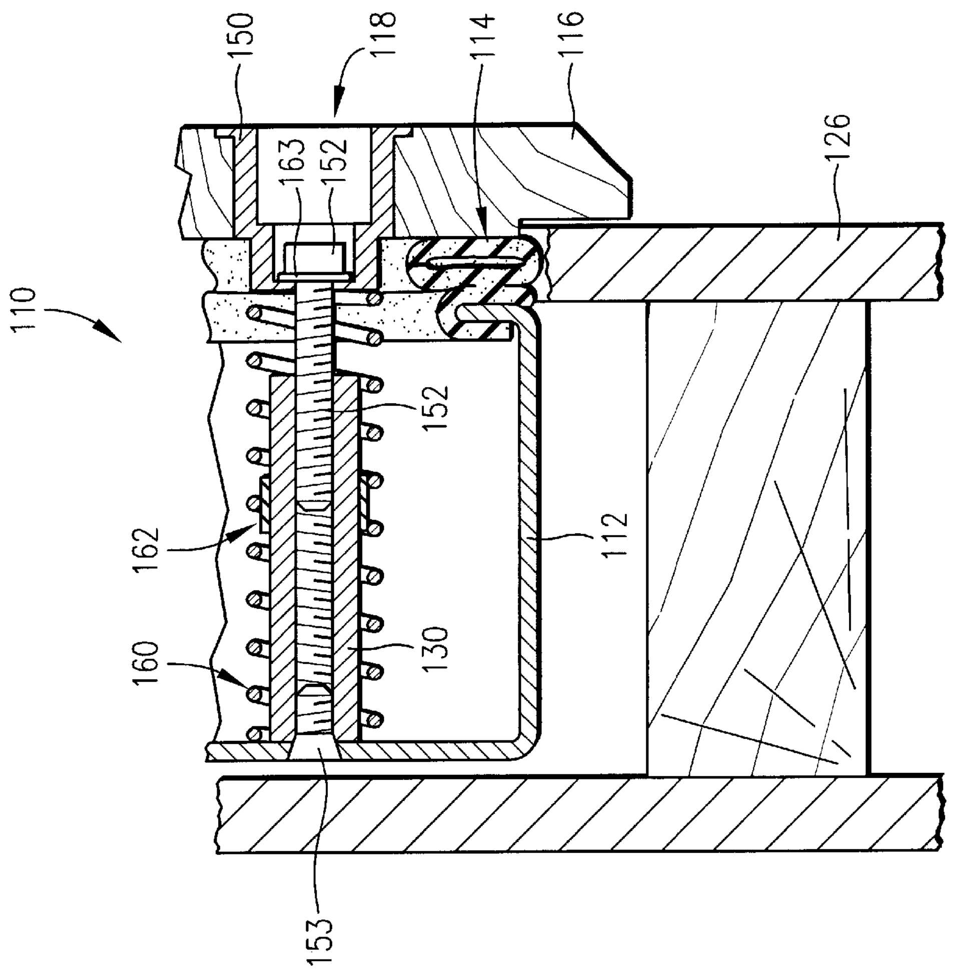
FIG. 5 is a fragmentary sectional view of an equally preferred alternative embodiment of the speaker enclosure, wherein the faceplate is in a final mounting position with the isolating and insulating gasket compressed, and a spring and a spacer ring is included to resist over-compression of the gasket, thereby facilitating maintaining the optimum degree of separation between the faceplate and the mounting surface.

Referring also to FIG. 5, an equally preferred alternative embodiment of the speaker enclosure 110 is shown, being substantially similar or identical to the embodiment described above, including the speaker box 112; the gasket 114; and the faceplate 116. Some or all of the coupling mechanisms 118, however, have been adapted to accommodate heavier and lower frequency speakers, such as bass woofers and subwoofers. More particularly, a spring 160 and a spacer ring 162 have been added to the coupling mechanisms 118, or, at least, to those coupling mechanisms 118 located on a lower portion of the speaker enclosure 110. The spring 160 fits over and about the mounting pylon 130, whereafter the coupling mechanism 118 is assembled as described above, with the bolt 152 being threadably received within the mounting pylon 130. The spring's spring constant or rate, k, will be determined by the weight and nature of the speaker meant to be supported; a spring constant of approximately 40 lbs/in is contemplated to be suitable for most applications, though spring constants of between approximately 51 lb/in and 50 lbs/in may by used. In a preferred embodiment, the spring 160 has a deflection of 0.5 in under a load of 20 lbs.

The spacer ring 162 surrounds the mounting pylon 130 and operates to keep the spring 160 centered thereabout in its proper operating position. The spacer ring 162 may be constructed of foam or any other suitable material which will resist making noise due to movement of the spring 160 thereagainst.

Just as the gasket 114 operates to adjustably suspend or isolate the faceplate 116 above the drywall surface 126 and ensure optimum separation therebetween, the spring 160 operates to ensure that such suspension and isolation is maintained when a heavier speaker is mounted whose weight would otherwise overwhelm the gasket 114 alone. In order to further facilitate such suspension and isolation, a rubber washer-gasket 163 may be placed between the sleeve 150 and the head of the bolt 152, thereby substantially preventing undesirable transmission of vibration therebetween.

When properly assembled, a first end of the spring 160 will rest against the back portion of the speaker enclosure 112, and the other end of the spring 160 will rest against the sleeve 150. When the speaker enclosure 110 is placed in position and the bolts 152 tightened on the rubber washer-gasket 163, the spring 160 will resist over-compression of the lower portion of the gasket 114, thereby facilitating maintaining an optimum degree of uniform separation between the faceplate 116 and the drywall 126.

As is also shown in the alternative embodiment of FIG. 5, the mounting pylon 130 may be secured to the back portion of the speaker enclosure 112 by a countersunk bolt 153 which is screwed into a back end of the mounting pylon 130 opposite the bolt 152.

From the preceding description, it can be seen that the speaker enclosure 10 and mounting method of the present invention provide a simple and inexpensive means for suspending or isolating and insulating faceplate 16 and speakers from a mounting wall 20, thereby reducing distortion, vibration, and damage. The faceplate 16 and speakers are suspended or isolated from the wall 20 by the collapsible air pocket 44 which allows the gasket 14 to compress until the faceplate 16 appears to be flush with the wall surface but, in fact, a separation of 1/64 to 3/64 inch remains. Because there is no direct contact between faceplate 16 and wall 20, sound distortion is minimized and damaging speaker vibrations are not transmitted directly to the drywall 26. Furthermore, the faceplate 16 and speakers are insulated from the mounting wall 20 by the rubber gasket 14 which tends to reduce speaker vibrations transmitted from the faceplate 16, to the speaker box 12, and thereafter to the wall studs 22 or other mounting structure.

Although the invention has been described with reference to the preferred embodiment illustrated in the attached drawings, it is noted that equivalents may be employed and substitutions made herein without departing from the scope of the invention as recited in the claims. For example, as described above, the present invention is independent of any particular box-to-stud mounting method, though a preferred method is incorporated by reference. Furthermore, although shown as being mounted within a wall, the enclosure may be mounted beneath any surface or within any structure, such as a ceiling, floor, column, or other structural feature as may be desired and practical.

Having thus described the preferred embodiment of the invention, what is claimed as new and desired to be protected by Letters Patent includes the following:

What is claimed is:

1. A speaker enclosure comprising:

a speaker box presenting an opening and mountable beneath a surface such that the opening is accessible through the surface;

a compressible gasket affixed to a perimeter of the opening such that the compressible gasket, when uncompressed, protrudes beyond the surface; and a faceplate attachable to the speaker box over the opening by a coupling mechanism, the coupling mechanism being adjustable to cause the faceplate to contact and compress the compressible gasket, leaving a degree of separation between the faceplate and the surface, the coupling mechanism including a spring operable to resist over-compression of the compressible gasket, wherein the degree of separation is between 1/64 inch and 3/64 inch.

2. A speaker enclosure comprising:

a speaker box presenting an opening and mountable beneath a surface such that the opening is accessible through the surface;

a compressible gasket affixed to a perimeter of the opening such that the compressible gasket, when uncompressed, protrudes beyond the surface; and a faceplate attachable to the speaker box over the opening by a coupling mechanism, the coupling mechanism being adjustable to cause the faceplate to contact and compress the compressible gasket, leaving a degree of separation between the faceplate and the surface, the coupling mechanism including a spring operable to resist over-compression of the compressible gasket, wherein the spring has a spring constant of between 1 lb/in and 50 lbs/in.

3. A speaker enclosure comprising:

a speaker box presenting an opening and mountable beneath a surface such that the opening is accessible through the surface;

a compressible gasket affixed to a perimeter of the opening such that the compressible gasket, when uncompressed, protrudes beyond the surface;

a faceplate attachable to the box over the opening; and a plurality of coupling mechanisms, each being independently adjustable to cause the faceplate to contact and compress the gasket leaving a substantially uniform degree of separation between the faceplate and the surface, with at least a lower coupling mechanism of the plurality of coupling mechanisms including a spring, having a spring constant of between approximately 1 lb/in and 50 lbs/in, operable to resist over-compression of the compressible gasket, and a spacer operable to maintain the spring in an operating position.

4. The speaker enclosure as set forth in claim 3, the compressible gasket having a tubular section defining a collapsible air pocket.

5. The speaker enclosure as set forth in claim 3, the substantially uniform degree of separation being between $\frac{1}{64}$ inch and $\frac{3}{64}$ inch.

6. The speaker enclosure as set forth in claim 3, the surface being a wall and the speaker box being mountable to a stud within the wall.

7. A method of mounting a speaker enclosure within a surface, the speaker enclosure comprising a speaker box, a gasket, a faceplate, and a plurality of independently adjustable coupling mechanisms, the method comprising the steps of:

(a) providing a hole in the surface operable to receive the speaker box;

(b) securing the speaker box beneath the surface;

(c) coupling the faceplate to the speaker box by adjusting each independently adjustable coupling mechanism to compress the gasket between the faceplate and the speaker box, leaving a substantially uniform degree of separation between the faceplate and the surface, wherein the substantially uniform degree of separation between the faceplate and the surface is between $\frac{1}{64}$ inch and $\frac{3}{64}$ inch; and (d) resisting over-compression of the gasket with a spring, thereby facilitating the substantially uniform degree of separation.

8. A speaker enclosure comprising:

a speaker box presenting an opening and being mountable beneath a surface such that the opening is accessible through the surface;

a compressible gasket affixed to a perimeter of the opening such that the compressible gasket, when uncompressed, protrudes beyond the surface;

a faceplate; and a coupling mechanism including a threaded body and a spring adapted to adjustably couple the faceplate to the speaker box over the opening such that the faceplate contacts and compresses the compressible gasket, leaving a degree of separation between the faceplate and the surface, wherein the spring resists over-compression of the compressible gasket.

* * * * *